United States Patent
Tsai et al.

(10) Patent No.: US 9,230,962 B2
(45) Date of Patent: Jan. 5, 2016

(54) SEMICONDUCTOR DEVICE AND FABRICATION METHOD THEREFOR

(71) Applicant: TAIWAN SEMICONDUCTOR MANUFACTURING COMPANY, LTD., Hsinchu (TW)

(72) Inventors: Tsung-Chieh Tsai, Chu-Bei (TW); Yung-Che Albert Shih, Hsinchu (TW); Jhy-Kang Ting, Baoshan Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/189,257

(22) Filed: Feb. 25, 2014

(65) Prior Publication Data

US 2014/0167178 A1    Jun. 19, 2014

Related U.S. Application Data

(63) Continuation of application No. 13/247,286, filed on Sep. 28, 2011, now Pat. No. 8,685,808.

(51) Int. Cl.
H01L 27/092 (2006.01)
H01L 29/66 (2006.01)
H01L 21/8238 (2006.01)
H01L 27/02 (2006.01)
H01L 21/762 (2006.01)
H01L 29/06 (2006.01)
H01L 29/78 (2006.01)
H01L 29/165 (2006.01)

(52) U.S. Cl.
CPC ........ *H01L 27/092* (2013.01); *H01L 21/76224* (2013.01); *H01L 21/823807* (2013.01); *H01L 21/823814* (2013.01); *H01L 21/823828* (2013.01); *H01L 27/0207* (2013.01); *H01L 29/0607* (2013.01); *H01L 29/0649* (2013.01); *H01L 29/66545* (2013.01); *H01L 29/165* (2013.01); *H01L 29/7848* (2013.01)

(58) Field of Classification Search
CPC ..................... H01L 21/28008; H01L 29/408
USPC ........................................................ 257/288
See application file for complete search history.

(56) References Cited

U.S. PATENT DOCUMENTS

| | | |
|---|---|---|
| 6,303,418 B1 * | 10/2001 | Cha et al. .................. 438/199 |
| 6,562,713 B1 | 5/2003 | Belyansky et al. |
| 7,259,432 B2 | 8/2007 | Tamaru |
| 2005/0194637 A1 * | 9/2005 | Tamaru ...................... 257/333 |
| 2005/0224830 A1 * | 10/2005 | Blonder et al. .............. 257/100 |
| 2008/0237663 A1 | 10/2008 | Hanafi |
| 2008/0305599 A1 | 12/2008 | Chuang et al. |
| 2011/0159678 A1 | 6/2011 | Hsu et al. |
| 2011/0193179 A1 | 8/2011 | Fung et al. |
| 2011/0195549 A1 | 8/2011 | Chuang et al. |
| 2011/0215404 A1 | 9/2011 | Zhu et al. |
| 2011/0227167 A1 | 9/2011 | Chuang et al. |
| 2012/0025329 A1 | 2/2012 | Wu et al. |
| 2012/0289040 A1 | 11/2012 | Huang et al. |

* cited by examiner

*Primary Examiner* — Marc Armand
(74) *Attorney, Agent, or Firm* — Hauptman Ham, LLP

(57) ABSTRACT

A semiconductor device includes a non-conductive gate feature over a substrate and a spacer adjoining each sidewall of the non-conductive gate feature.

20 Claims, 10 Drawing Sheets

SEMICONDUCTOR DEVICE AND FABRICATION METHOD THEREFOR

CROSS REFERENCE TO RELATED APPLICATIONS

The present application is a divisional of U.S. application Ser. No. 13/247,286, filed Sep. 28, 2011, which is incorporated herein by reference in its entirety.

FIELD

The disclosure relates to integrated circuit fabrication and, more particularly, to a semiconductor device with a strained structure.

BACKGROUND

When a semiconductor device, such as a metal-oxide-semiconductor field-effect transistor (MOSFET), is scaled down through various technology nodes, high-k gate dielectric layer and metal gate electrode layer are incorporated into the gate stack of the MOSFET to improve device performance with the decreased feature sizes. The MOSFET processes comprise a "gate last" process to replace an original polysilicon gate electrode with the metal gate electrode to improve device performance.

However, there are challenges to implement such features and processes in complementary metal-oxide-semiconductor (CMOS) fabrication. As the gate length and spacing between devices decrease, these problems are exacerbated. For example, it is difficult to prevent parasitic capacitance resulted among gate stacks of the MOSFET because of the reduced spacing between the gate stacks, thereby affecting the device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the relative dimensions of the various features may be arbitrarily increased or reduced for clarity of discussion.

DESCRIPTION

Figure 1:
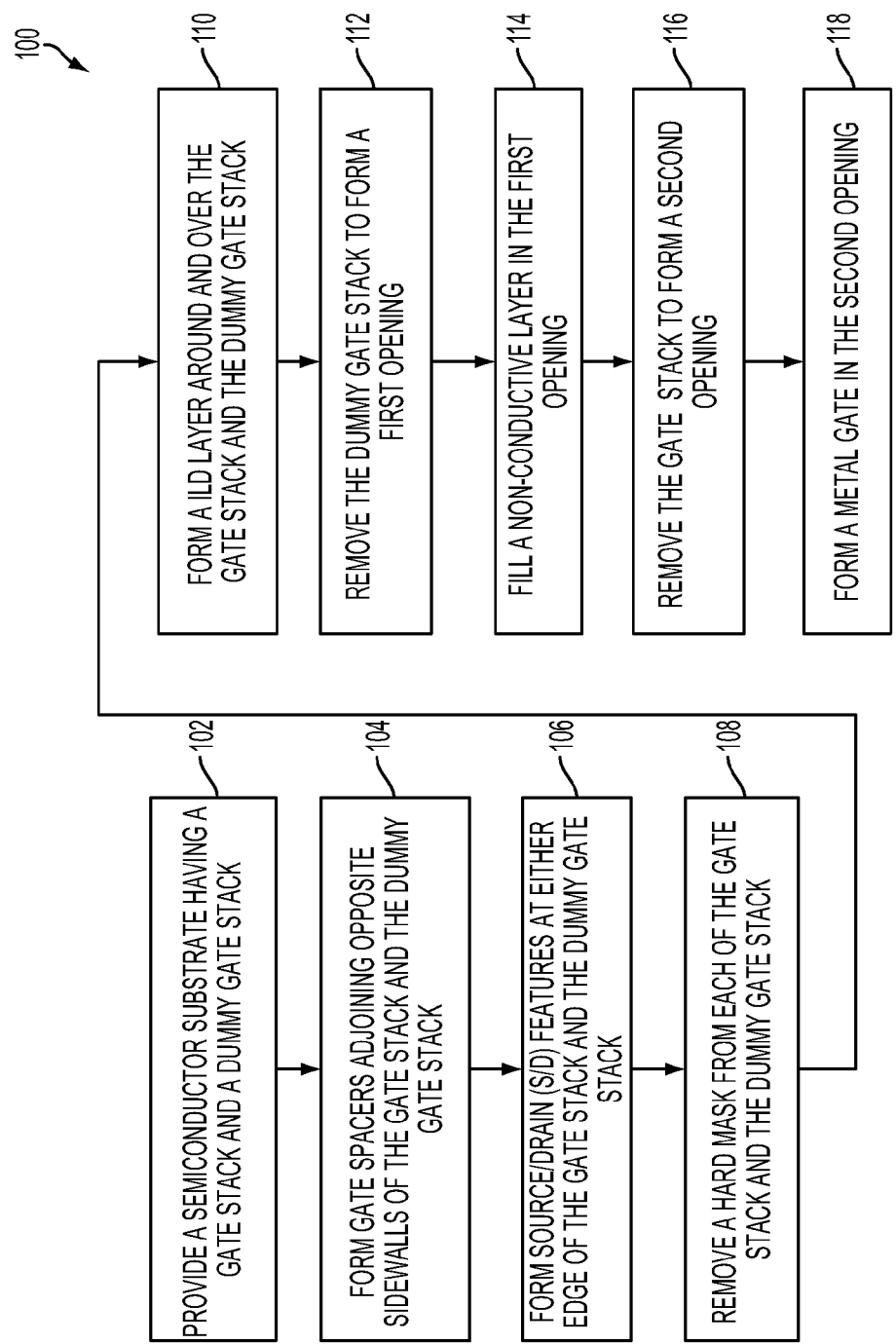
FIG. 1 is a flowchart of a method of fabricating a semiconductor device comprising gate stacks according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of a method 100 of fabricating a semiconductor device 200 (FIGS. 2-10) according to various aspects of the present disclosure. FIGS. 2-10 are schematic cross-sectional views of a semiconductor device 200 at various stages of fabrication according to an embodiment of the method 100 of FIG. 1. The semiconductor device 200 may be at least a portion of a microprocessor, memory cell, and/or other integrated circuit (IC). It is noted that the method of FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 10 are simplified for a better understanding of the present disclosure. For example, although the figures illustrate the semiconductor device 200, it is understood the IC may comprise a number of other devices comprising resistors, capacitors, inductors, fuses, etc.

Figure 2:
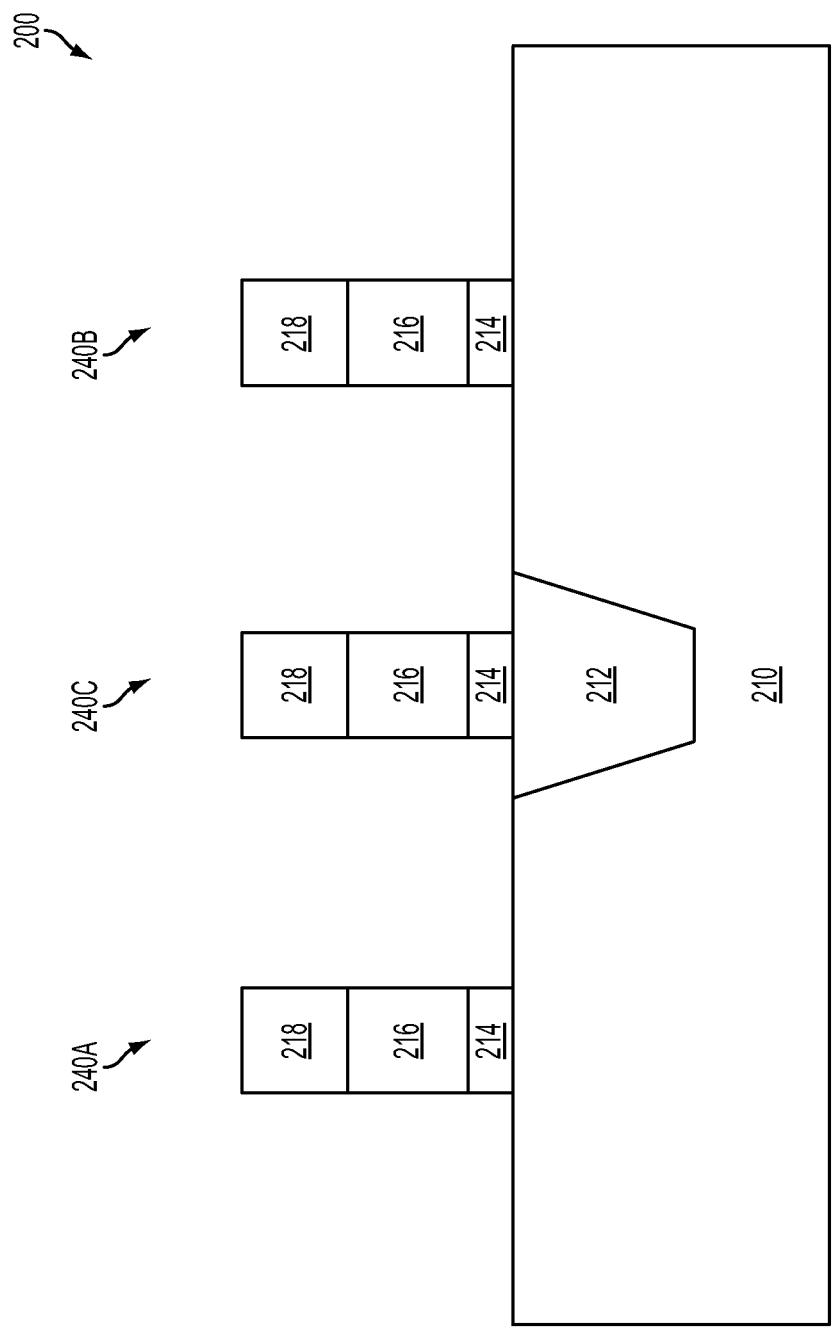
FIGS. 2-10 are schematic cross-sectional views of the gate stacks of a semiconductor device at various stages of fabrication according to various aspects of the present disclosure.

Referring to FIGS. 1 and 2, the method 100 begins at step 102 wherein a substrate 210 is provided. In at least one embodiment, the substrate 210 comprises a crystalline silicon substrate (e.g., wafer). In an alternative embodiment, the substrate 210 may include a silicon-on-insulator (SOI) structure. The substrate 210 may further comprise active regions (not shown). The active regions may include various doping configurations depending on design requirements as known in the art. In some embodiments, the active regions may be doped with p-type or n-type dopants. For example, the active regions may be doped with p-type dopants, such as boron or $BF_2$, to perform the doping; n-type dopants, such as phosphorus or arsenic, to perform the doping; and/or combinations thereof. The active regions may act as regions configured for an N-type metal-oxide-semiconductor transistor device (referred to as an NMOS) and regions configured for a P-type metal-oxide-semiconductor transistor device (referred to as a PMOS).

In some embodiments, an isolation structure 212 is formed in the substrate 210 to isolate the various active regions. The isolation structure 212, for example, is formed using isolation technology, such as local oxidation of silicon (LOCOS) or shallow trench isolation (STI), to define and electrically isolate the various active regions. In the present embodiment, the isolation structure 212 includes a STI. The isolation structure 212 may comprise silicon oxide, silicon nitride, silicon oxynitride, fluoride-doped silicate glass (FSG), a low-K dielectric material, other suitable materials, and/or combinations thereof. The isolation structure 212, and in the present embodiment, the STI, may be formed by any suitable process. As one example, the formation of the STI may include patterning the semiconductor substrate 210 by a photolithography process, etching a trench in the substrate 210 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Still referring to FIG. 2, in at least one embodiment, gate stacks 240A, 240B, and 240C are formed over the surface of the substrate 210. In the present embodiment, the gate stacks 240A, 240B are designed for forming active devices, and the gate stack 240C is a dummy gate stack. In the present embodiment, the dummy gate stack 240C is over the isolation structure 212 and between the gate stacks 240A and 240B. In some embodiments, each of the gate stacks 240A, 240B, and the dummy gate stack 240C comprises, in order, a gate dielectric feature 214, a gate electrode feature 216, and a hard mask feature 218 over the substrate 210. In some embodiments, a gate dielectric layer (not shown), a gate electrode layer (not shown), and a hard mask layer (not shown) are sequentially deposited over the substrate 210. Then, a patterned photo-sensitive layer (not shown) is formed over the hard mask layer. The pattern of the photo-sensitive layer is transferred to the hard mask layer and then transferred to the gate electrode layer and gate dielectric layer to form the gate stacks 240A, 240B, and the dummy gate stack 240C. The photo-sensitive layer is stripped thereafter by a dry and/or wet stripping process.

The gate dielectric feature 214, in one example, is a thin film comprising silicon oxide, silicon nitride, silicon oxy-nitride, high dielectric constant (high-k) dielectrics, other suitable dielectric materials, or combinations thereof. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and/or mixtures thereof. In the present embodiment, the gate dielectric feature 214 comprises a high-k dielectric layer with a thickness in the range of about 10 angstroms to about 30 angstroms. The gate dielectric feature 214 may be formed using a suitable process such as atomic layer deposition (ALD), chemical vapor deposition (CVD), physical vapor deposition (PVD), thermal oxidation, UV-ozone oxidation, or combinations thereof. An interfacial layer (not shown) may further be included under the gate dielectric feature 214 to reduce the risk of damage between the gate dielectric feature 214 and the substrate 210. The interfacial layer may comprise silicon oxide.

In some embodiments, the gate electrode feature 216 over the gate dielectric feature 214 comprises a single layer or multilayer structure. In the present embodiment, the gate electrode feature 216 may comprise poly-silicon. Further, the gate electrode feature 216 may be doped poly-silicon with the same or different doping species. In at least one embodiment, the gate electrode feature 216 has a thickness in the range of about 30 nm to about 60 nm. The gate electrode feature 216 may be formed using a process such as low-pressure chemical vapor deposition (LPCVD), plasma enhanced chemical vapor deposition (PECVD), other suitable processes, or combinations thereof. In at least one embodiment, silane ($SiH_4$) is used as a chemical gas in the CVD process to form the gate electrode feature 216. In other embodiments, the gate electrode feature 216 and/or the gate dielectric feature 214 may be sacrificial layers and will be removed by a replacement step in the subsequent processes.

In some embodiments, the hard mask feature 218 over the gate electrode feature 216 comprises silicon oxide. In some alternative embodiments, the hard mask feature 218 may comprise silicon nitride, silicon oxynitride, and/or other suitable dielectric materials, and may be formed using a method such as CVD or PVD. In some embodiments, the hard mask feature 218 has a thickness in the range from about 100 angstroms to about 800 angstroms.

Figure 3:
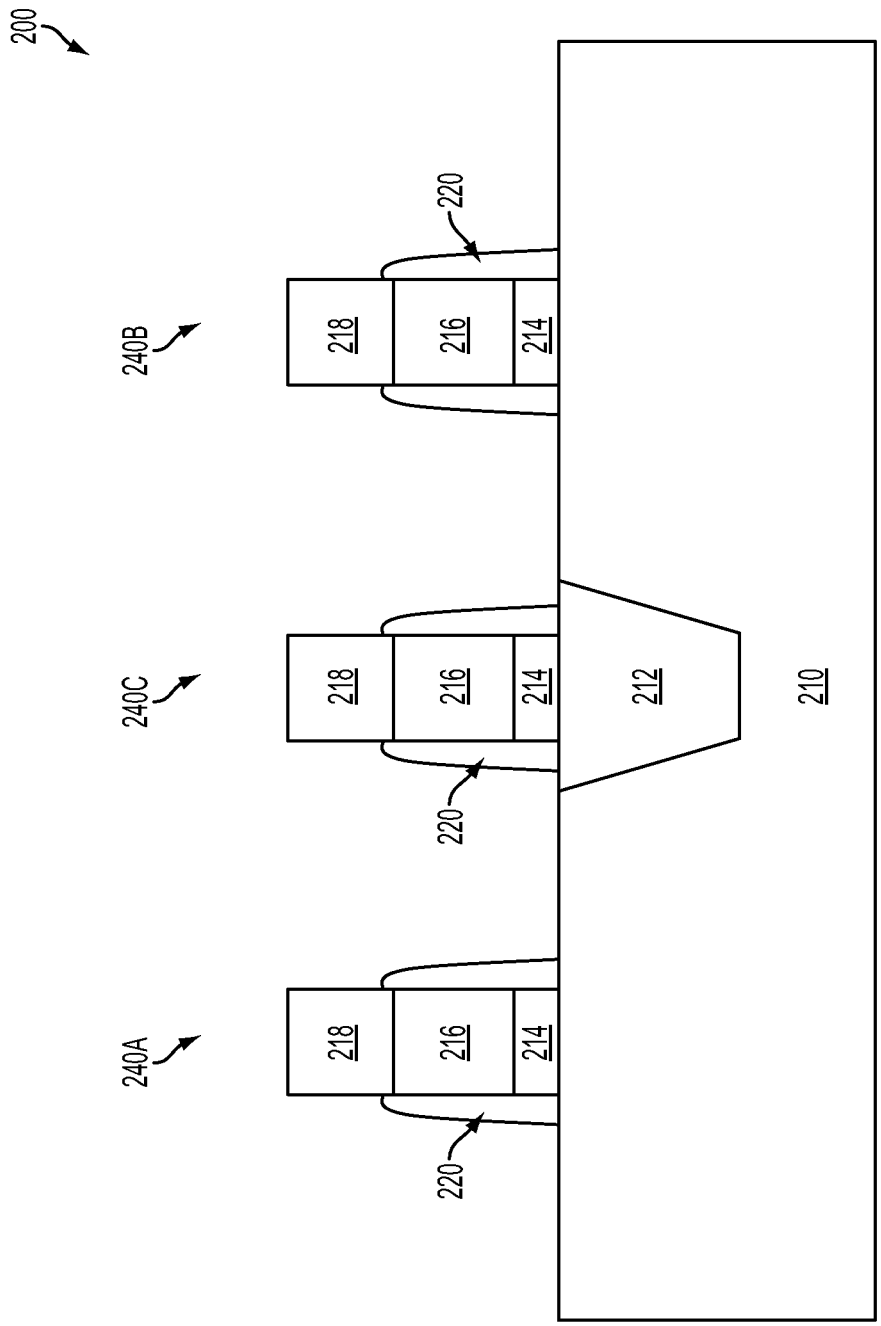

Referring to FIGS. 1 and 3, the method 100 proceeds to step 104 wherein gate spacers 220 are formed adjoining opposite sidewalls of the gate stacks 240A, 240B, and the dummy gate stack 240C. In some embodiments, the gate spacers 220 may include a single-layer or a multiple-layer structure. In the present embodiment, a blanket layer of spacer material (not shown) is formed around and over the gate stacks 240A, 240B, and the dummy gate stack 240C by a depositing process including CVD, PVD, ALD, or other suitable techniques. In some embodiments, the spacer material comprises silicon oxide, silicon nitride, silicon oxy-nitride, other suitable material, or combinations thereof. In some embodiments, the spacer material has a thickness ranging from about 5 nm to about 15 nm. Then, an anisotropic etching process is performed on the spacer material to form the gate spacers 220. In some embodiments, the gate spacers 220 have a height less than the height of the gate stacks 240A, 240B, and the dummy gate stack 240C. In at least one embodiment, the gate spacers 220 are adjoining sidewalls of the gate dielectric feature 214 and the gate electrode feature 216, but expose sidewalls of the hard mask feature 218.

Figure 4:
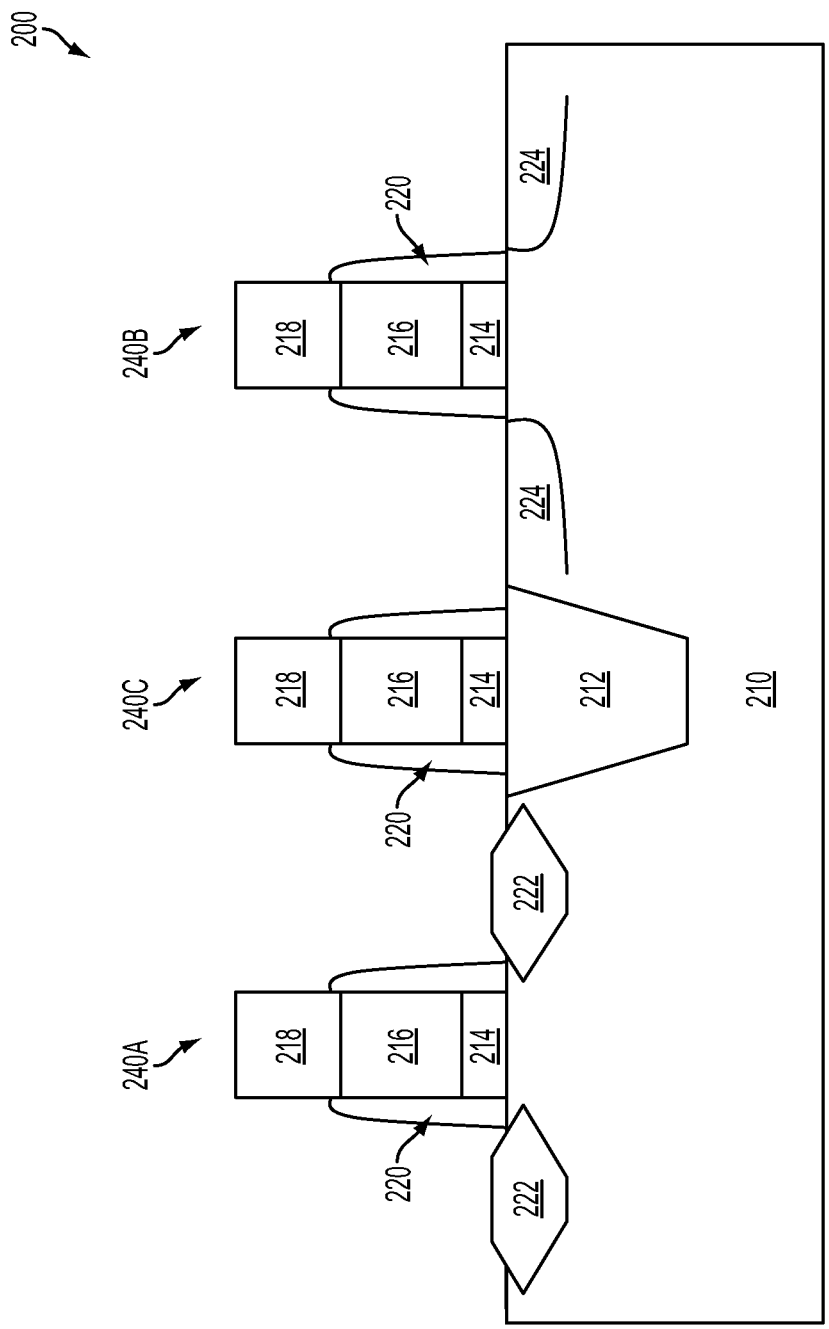

Referring to FIGS. 1 and 4, the method 100 continues with step 106 in which source/drain (S/D) features 222, 224 are formed in the substrate 210. In at least one embodiment, the source/drain (S/D) features 222 and the gate stack 240A are configured for forming a PMOS device, and the source/drain (S/D) features 224 and the gate stack 240B are configured for forming an NMOS device. The formation processes of the S/D features 222 may start from forming recess cavities (not shown) at either side of the gate stack 240A in the substrate 210. In the present embodiment, the recess cavities are formed using an isotropic dry etching process and then followed by an anisotropic wet or dry etching process. In some embodiments, a strained material is grown and filled in the recess cavities to form the S/D features 222. In some embodiments, the growth process of the strained material comprises selective epitaxy growth (SEG), cyclic deposition and etching (CDE), chemical vapor deposition (CVD) techniques (e.g., vapor-phase epitaxy (VPE) and/or ultra-high vacuum CVD (UHV-CVD)), molecular beam epitaxy (MBE), other suitable epi processes, or combinations thereof. In some embodiments, the strained material is silicon germanium (SiGe). In some embodiments, the strained material is epi SiGe with p-type dopants, such as boron.

In at least one embodiment, the S/D features 224 are formed at either side of the gate stack 240B in the substrate 210 by one or more ion implantation processes. The implantation, for example, is performed using n-type dopants, such as phosphorus or arsenic, under predetermined implantation energy and title angle to meet the requirements of device performance. In an alternative embodiment, the S/D features 224 include epi silicon (Si) with n-type dopants. Processes for forming the epi Si may include some etching processes for forming recess cavities (not shown) in the substrate 210 and then filling the recess cavities with the epi Si. The growth process of the epi Si comprises SEG, CDE, CVD techniques, MBE, other suitable epi processes, or combinations thereof.

Figure 5:
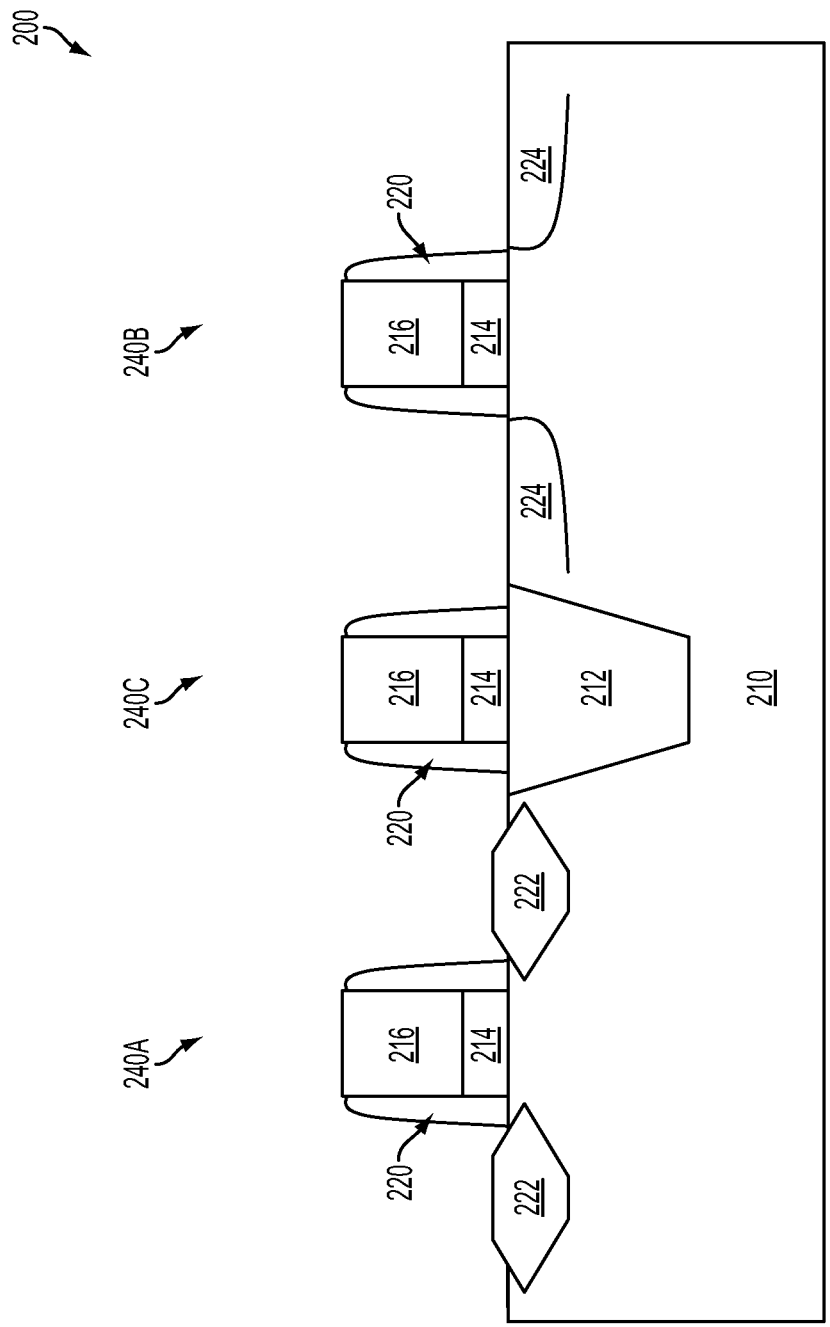

Referring to FIGS. 1 and 5, the method 100 continues with step 108 in which the hard mask feature 218 is removed from the gate stacks 240A, 240B, and the dummy gate stack 240C by an etching process. The etching process, for example, is a dry etching process using $NF_3$ gas and/or argon gas, with flow rates ranging from about 10 sccm to about 100 sccm and from about 10 sccm to about 200 sccm, respectively. In some embodiments, the etching process is performed with an RF bias ranging between about 60 V and about 200V, under a vacuum pressure ranging from about 10 mTorr to about 100 mTorr. The step of removing the hard mask feature 218 may reduce the heights of the gate stacks 240A, 240B, and the dummy gate stack 240C, therefore, reducing the aspect ratio of the gaps between the gate stacks 240A, 240B, and the dummy gate stack 240C. The reduced aspect ratio is helpful for a subsequent gap filling process.

Figure 6:
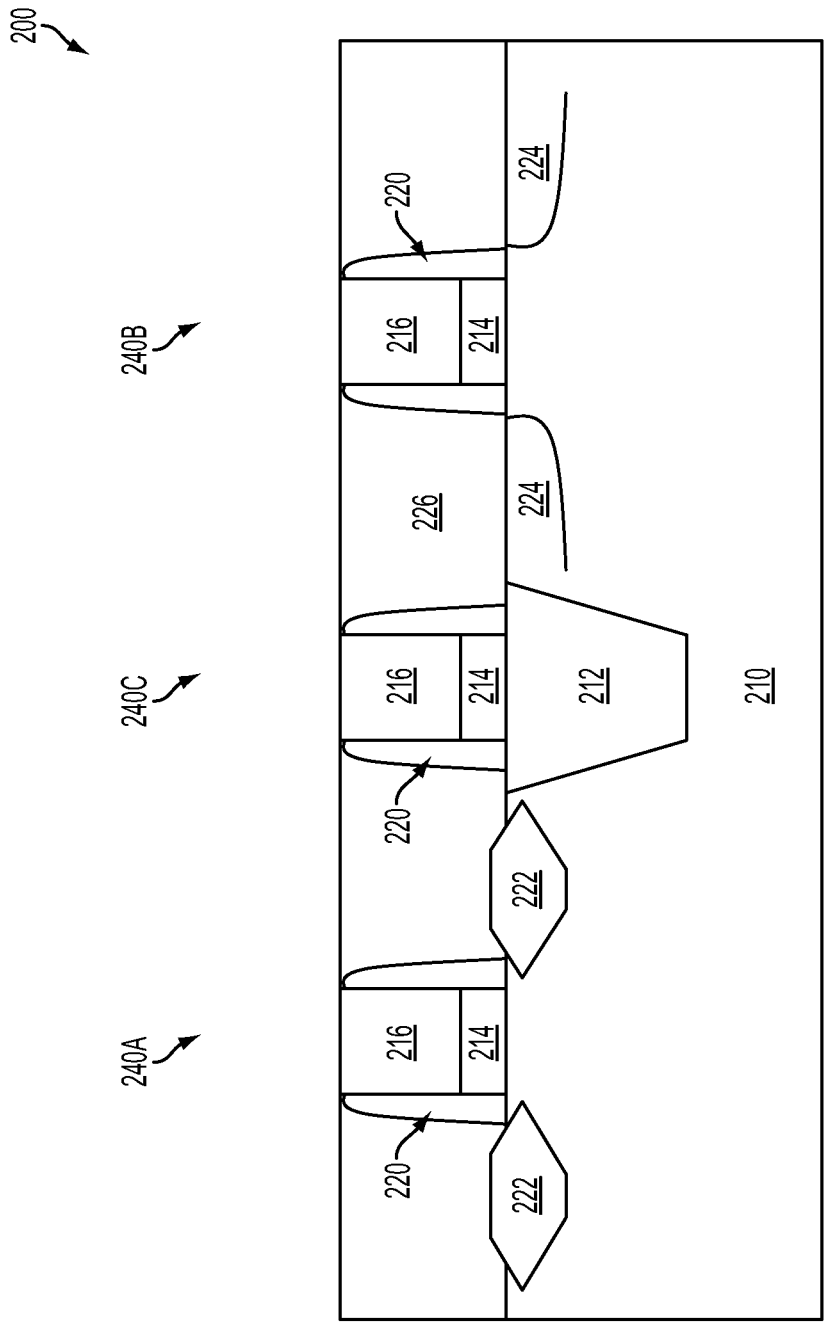

Referring to FIGS. 1 and 6, the method 100 continues with step 110 in which an interlayer dielectric (ILD) 226 is filled among the gate stacks 240A, 240B and the dummy gate stack 240C. The ILD 226 may include materials such as oxide, nitride, oxynitride, low dielectric constant (low-k) dielectric material, ultra low-k dielectric material, extreme low-k dielectric material, other dielectric material, and/or combinations thereof. In some embodiments, the ILD 226 is formed by depositing an ILD layer (not shown) around and over the gate stacks 240A, 240B and the dummy gate stack 240C, then, applying a planarization process to remove the portion of ILD layer over the gate stacks 240A, 240B and the dummy gate stack 240C. In some embodiment, the step of depositing the ILD layer comprises a CVD process, a HDP CVD process, a HARP, a spin-coating process, other deposition process, and/or any combinations thereof. In some embodiment, the planarization process includes a chemical-mechanical polish (CMP) process, a dry etch process, a wet etch process, and/or combinations thereof. The planarization process may form the ILD 226 with a top surface substantially co-planer with the top surface of the gate stacks 240A, 240B and the dummy gate stack 240C.

Figure 7:
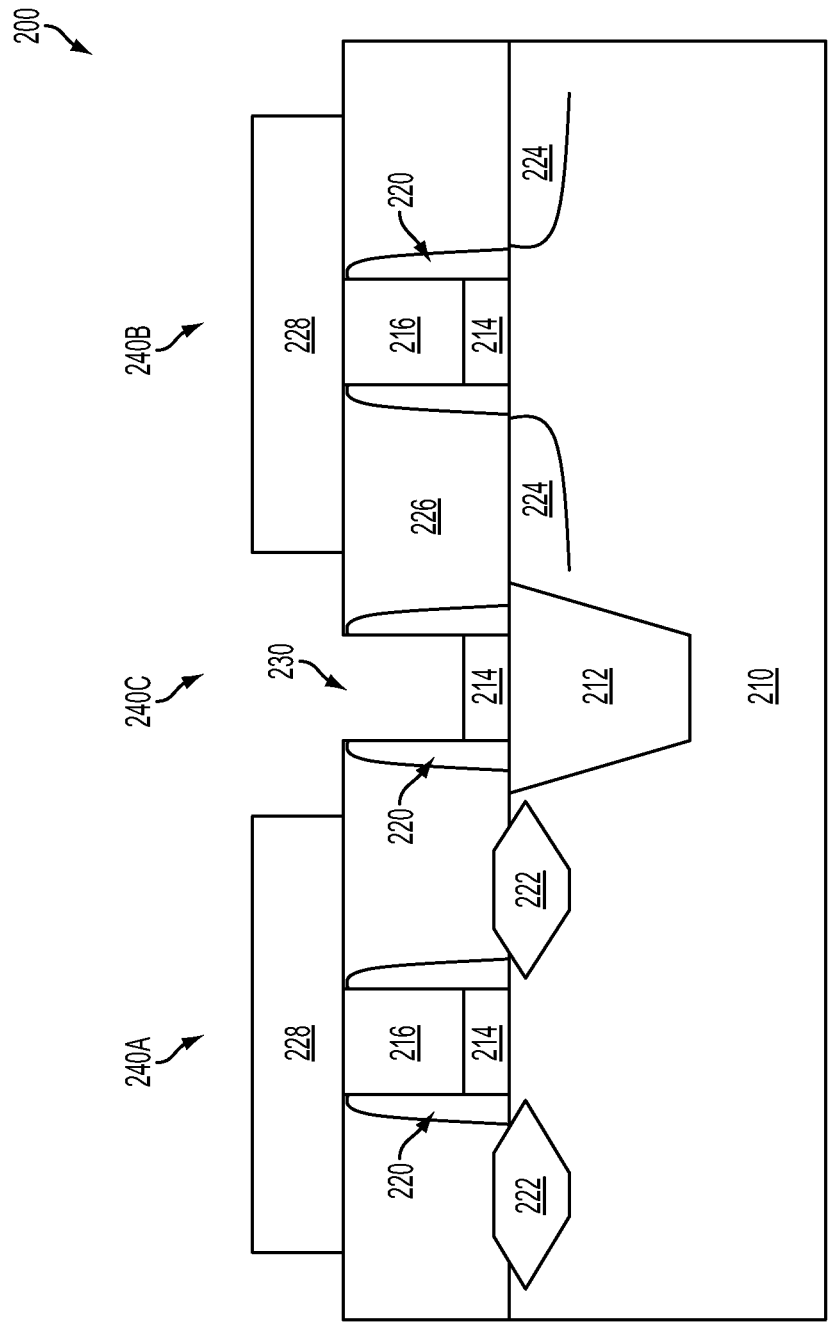

Referring to FIGS. 1 and 7, the method 100 continues with step 112 in which a removing process is provided to remove at least a portion of the dummy gate stack 240C, thereafter, an opening 230 is formed. The gate stacks 240A, 240B are not removed by the removing process because of being covered by protectors 228, e.g., photoresist patterns. In at least one embodiment, the removing process removes the gate electrode feature 216 of the dummy gate stack 240C but leaves the gate dielectric feature 214 of the dummy gate stack 240C. In an alternative embodiment, the removing process removes the gate electrode feature 216 and the gate dielectric 214 feature of the dummy gate stack 240C. The removing process can include a dry etch process and/or a wet etch process. In some embodiments, the removing process is a two-step dry etching process comprising a first step to break through (remove) a native oxide (not shown) over the gate electrode feature 216 and a second step to remove the gate electrode feature 216 (e.g., poly-silicon). In some embodiments, the first step of the etching process is performed using NF3 gas and/or argon gas, with flow rates ranging from about 10 sccm to about 100 sccm and from about 10 sccm to about 200 sccm, respectively. In some embodiments, the first step of the etching process is performed with an RF bias ranging between about 60 V and about 200V, under a vacuum pressure ranging from about 10 mTorr to about 100 mTorr. The second step of the etching process is performed, for example, using Cl gas, HBr gas, He gas, or combinations thereof. In the present embodiment, the flow rates of Cl gas, HBr gas, and He ranges from about 10 sccm to about 100 sccm, from about 200 sccm to about 400 sccm, and from about 100 sccm to about 300 sccm, respectively. In some embodiments, the second step of the etching process is performed with an RF bias ranging between about 60 V and about 200V. In some embodiments, the second step of the etching process is performed with an RF bias less than the RF bias for performing the first step of the etching process. In some embodiments, the second step of the etching process is performed under a vacuum pressure ranging from about 10 mTorr to about 100 mTorr. The protectors 228 are then removed using a stripping process after the removing process.

Figure 8:
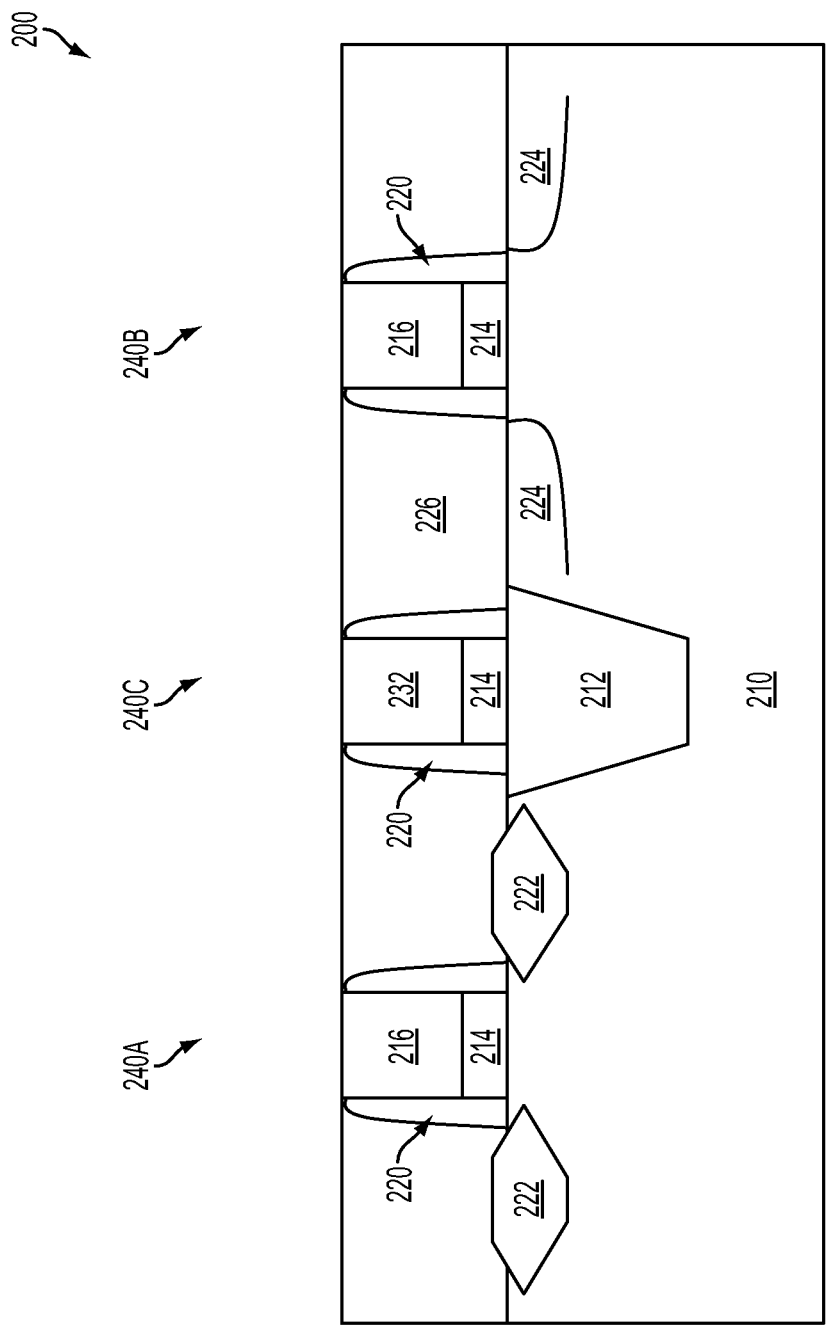

Referring to FIGS. 1 and 8, the method 100 continues with step 114 in which a non-conductive layer (not shown) is filled within and above the opening 230, and over the ILD 226. In the present embodiment, the non-conductive layer is dielectric including materials such as oxide, nitride, oxynitride, low-k dielectric material, ultra low-k dielectric material, extreme low-k dielectric material, other dielectric material, and/or combinations thereof. The non-conductive layer may be formed by, for example, a CVD process, a high-density plasma (HDP) CVD process, a high-aspect-ratio process (HARP), a spin-coating process, other deposition process, and/or any combinations thereof. Then, a planarizing process can be applied to remove the portion of the non-conductive layer above the opening 230 and over the ILD 226, thereby forming the non-conductive gate 232 having a top surface substantially co-planer with the top surface of the gate stacks 240A, 240B, or the ILD 226. The planarizing process can include a chemical-mechanical polish (CMP) process, a dry etch process, a wet etch process, and/or combinations thereof. In some embodiments, the non-conductive gate 232 has a material different from the material of the ILD 226, whereby there is a removing selectivity for the planarizing process.

Figure 9:
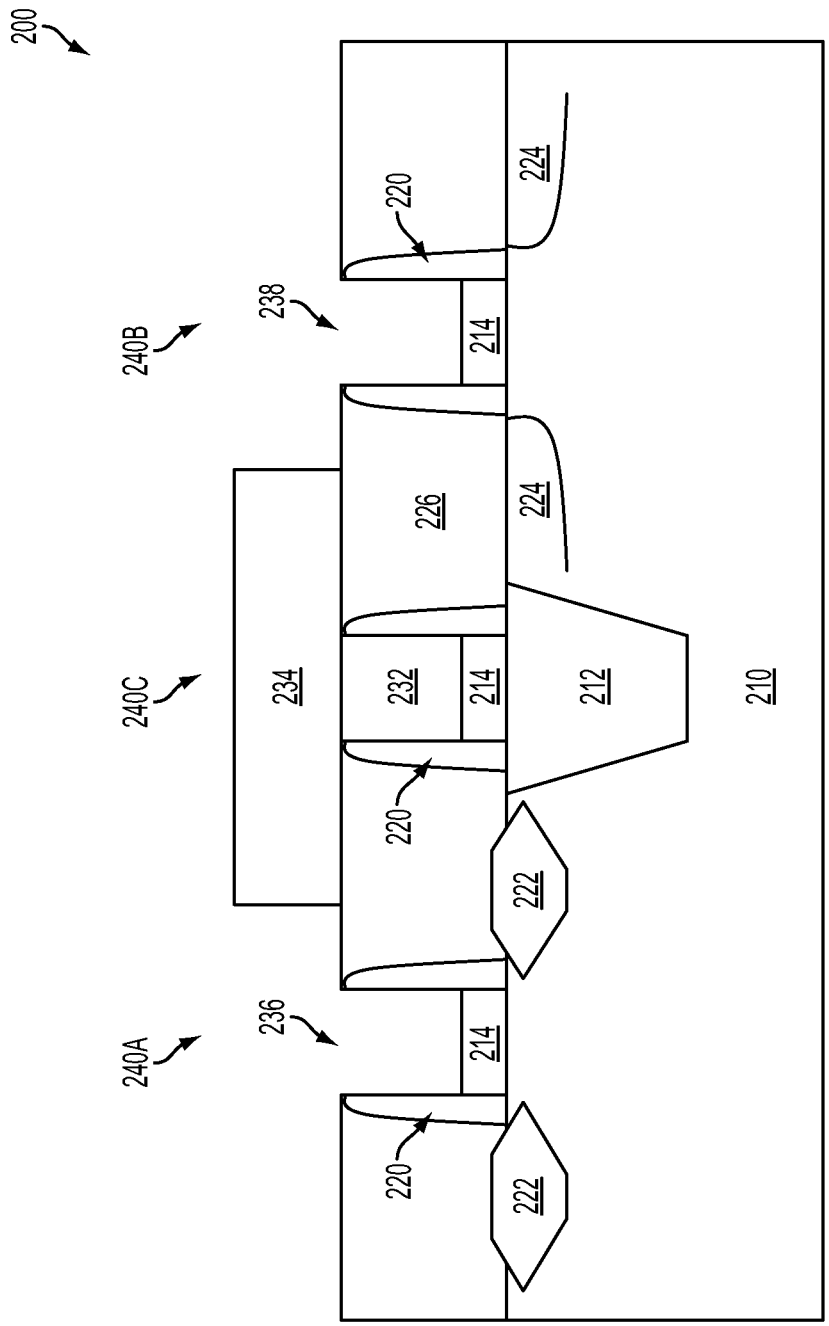
Figure 10:
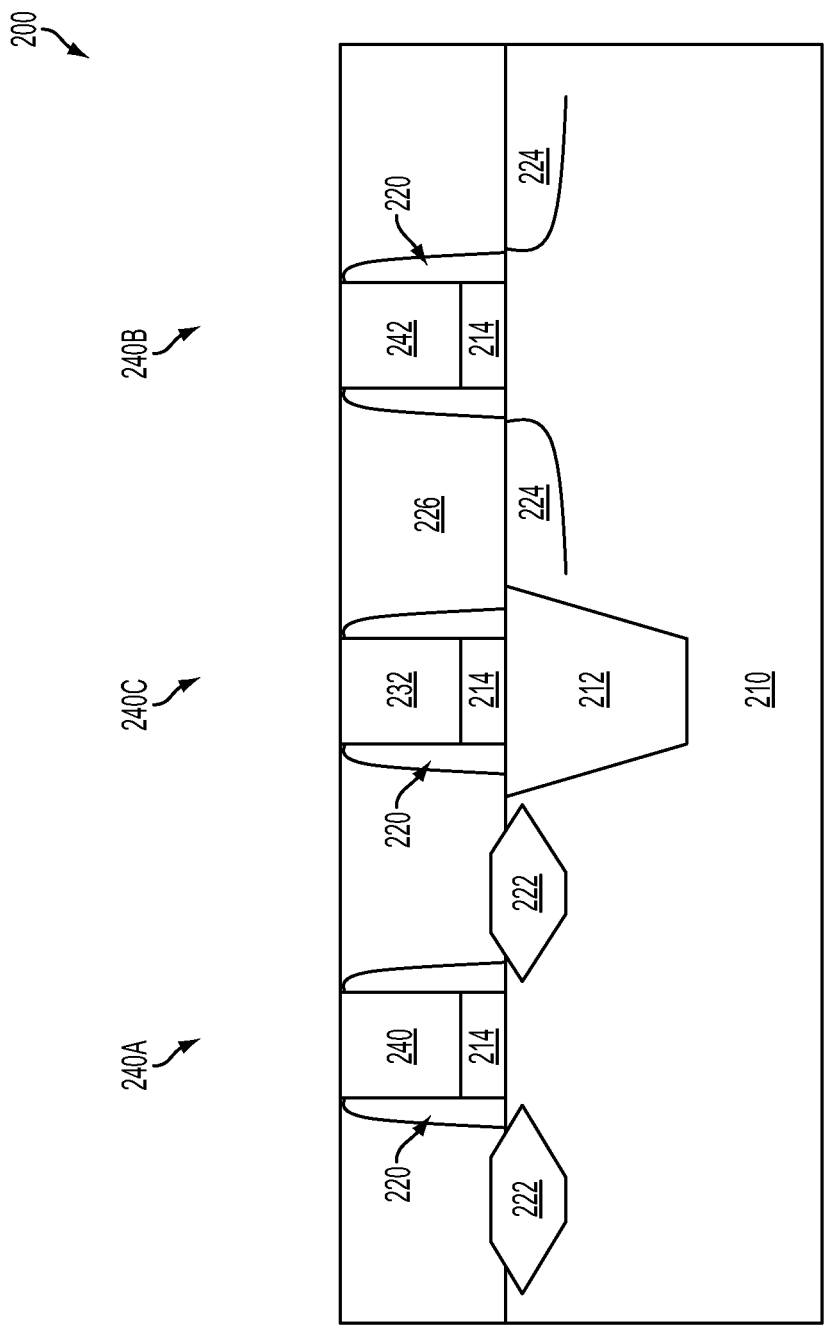

Referring to FIGS. 1 and 9, the method 100 continues with step 116 in which a removing process is provided to remove at least the gate electrode feature 216 of the gate stacks 240A, 240B to form openings 236, 238, respectively. The non-conductive gate 232 is not removed in the removing process by providing a protector 234, e.g., a photoresist pattern, thereon. In an embodiment, the removing process removes the gate electrode feature 216 of the gate stacks 240A, 240B but leaves the gate dielectric feature 214 of the gate stacks 240A, 240B if the gate dielectric feature 214 comprising a high-k dielectric material. In an alternative embodiment, the removing process removes the gate electrode feature 216 and the gate dielectric feature 214 of the gate stacks 240A, 240B if the gate dielectric feature 214 is not composed of a high-k dielectric material. The removing process can include a dry etch process and/or a wet etch process. In some embodiments, the removing process is a two-step dry etching process comprising a first step to break through a native oxide (not shown) over the gate electrode feature 216 and a second step to remove the gate electrode feature 216 (e.g., poly-silicon). In some embodiments, the first step of the etching process is performed using $NF_3$ gas and argon gas, with flow rates ranging from about 10 sccm to about 100 sccm and from about 10 sccm to about 200 sccm, respectively. In some embodiments, the two-step etching process is performed with the chemicals and conditions as mentioned above. The protector 234 is thereafter removed by a stripping process Referring to FIGS. 1 and 10, the method 100 continues with step 118 in which metal gates 240, 242 are formed in the openings 236, 238, respectively. The metal gates 240, 242 are formed to replace the gate electrode feature 216 (i.e., poly-silicon gate layer) of the gate stacks 240A, 240B As mentioned above, the gate stack 240A is designed for PMOS device and the gate stack 240B is designed for NMOS device. The metal gate 240 has a first work function for PMOS device and the metal gate 242 has a second work function for NMOS device. In some embodiments, the metal gates 240, 242 comprise any suitable material including aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

Subsequent processing may form various contacts/vias/lines and multilayer interconnect features (e.g., metal layers and interlayer dielectrics) over the substrate, which are configured to connect the various features or structures of the semiconductor device. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The various embodiments of the present disclosure discussed above offer advantage over conventional methods, it being understood that no particular advantage is required for all embodiments, and that different embodiments may offer different advantages. One of the advantages is that the spacing between the adjacent two conductive gates is increased, therefore, reducing the parasitic capacitance resulted among the transistor devices. Hence, the device operation speed may be enhanced to upgrade the device performance. Another advantage is that the likelihood of breakdown of ILD and/or device failure may be prevented.

In some embodiments, a semiconductor device comprises a non-conductive gate feature formed over a substrate and a spacer adjoining each sidewall of the non-conductive gate feature.

In some embodiments, a semiconductor device comprises a conductive gate feature and a non-conductive gate feature formed over a substrate and a spacer adjoining each sidewall of the conductive gate feature and the non-conductive gate feature.

In some embodiments, a semiconductor device comprises a first conductive gate feature, a second conductive gate feature, and a non-conductive gate feature over a substrate; a spacer adjoining each sidewall of the conductive gate features and the non-conductive gate feature; and an isolation structure under the non-conductive gate feature in the substrate.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a non-conductive gate feature over a substrate;
   a spacer adjoining each sidewall of the non-conductive gate feature; and
   an interlayer dielectric (ILD) adjacent to each spacer.

2. The device of claim 1, wherein the non-conductive gate feature is a dummy gate electrode comprising a dielectric material.

3. The device of claim 1, wherein the non-conductive gate feature is over a high-k dielectric layer.

4. The device of claim 1, further comprising an isolation structure in the substrate under the non-conductive gate feature.

5. The device of claim 1, wherein a top surface of the ILD is substantially co-planar with a top surface of the non-conductive gate feature.

6. The device of claim 2, wherein the dielectric material comprises at least one of silicon oxide, silicon nitride, silicon oxynitride, a low-k dielectric, an ultra low-k dielectric, or an extreme low-k dielectric.

7. A semiconductor device, comprising:
   a conductive gate feature and a non-conductive gate feature over a substrate;
   spacers adjoining sidewalls of the conductive gate feature and the non-conductive gate feature;
   a first gate dielectric layer under the conductive gate feature;
   a second gate dielectric layer under the non-conductive gate feature; and
   an isolation structure under the non-conductive gate feature in the substrate,
   wherein the first gate dielectric layer comprises a same material as the second gate dielectric layer.

8. The device of claim 7, wherein the conductive gate feature is a metal gate electrode for forming a transistor.

9. The device of claim 7, wherein the non-conductive gate feature is a dummy gate electrode comprising dielectric material.

10. The device of claim 7, further comprising an interlayer dielectric (ILD) between the conductive gate feature and the non-conductive gate feature.

11. The device of claim 7, wherein the first gate dielectric layer and the second gate dielectric layer comprise a high-k dielectric material.

12. The device of claim 8, wherein the metal gate electrode is configured to have a work function for an N-type metal-oxide-semiconductor (NMOS) device or a P-type metal-oxide-semiconductor (PMOS) device.

13. The device of claim 10, wherein a top surface of the ILD is substantially co-planar with a top surface of the conductive gate feature and a top surface of the non-conductive gate feature.

14. A semiconductor device, comprising:
   a first conductive gate feature, a second conductive gate feature, and a non-conductive gate feature over a substrate;
   spacers adjoining sidewalls of the first conductive gate feature, the second conductive gate feature, and the non-conductive gate feature;
   a high-k dielectric layer; and
   an isolation structure in the substrate under the non-conductive gate feature,
   wherein the non-conductive gate feature is over the high-k dielectric layer.

15. The device of claim 14, wherein the first conductive gate feature is a metal gate electrode for an NMOS transistor, and the second conductive gate feature is a metal gate electrode for a PMOS transistor.

16. The device of claim 14, further comprising an interlayer dielectric (ILD) between the first conductive gate feature and the non-conductive gate feature, and between the second conductive gate feature and the non-conductive gate feature.

17. The device of claim 14, wherein the spacers comprise a multi-layer structure.

18. The device of claim 14, wherein the spacers comprise one or more of silicon oxide, silicon nitride or silicon oxynitride.

19. The device of claim 15, wherein at least one of the first conductive gate feature or the second conductive gate feature is configured to have a work function for an NMOS device or a PMOS device.

20. The device of claim 16, wherein a top surface of the ILD is substantially co-planar with a top surface of the non-conductive gate feature.

* * * * *